United States Patent [19]
Hayashi et al.

[11] Patent Number: 4,902,726
[45] Date of Patent: Feb. 20, 1990

[54] PHOTOSENSITIVE RESIN COMPOSITION SOLUTION

[75] Inventors: Nobuyuki Hayashi; Katsushige Tsukada; Tadashi Fujii; Katsunori Tsuchiya, all of Hitachi, Japan

[73] Assignees: Hitachi Chemical Company, Ltd., Tokyo; Ibiden Co., Ltd., Ogaki, both of Japan

[21] Appl. No.: 192,785

[22] Filed: May 11, 1988

[30] Foreign Application Priority Data

May 19, 1987 [JP] Japan ................................. 62-121549

[51] Int. Cl.$^4$ .......................... G03C 1/00; H05K 3/28; C08F 2/50; C08K 3/22
[52] U.S. Cl. ......................................... 522/18; 522/79; 522/26; 522/81; 522/96; 522/100; 430/280; 430/281
[58] Field of Search ..................... 522/79, 18

[56] References Cited

U.S. PATENT DOCUMENTS 4,005,244  9/1974  Wismer et al. ..................... 522/79
4,544,623 10/1985  Audykowski et al. ............... 522/79

FOREIGN PATENT DOCUMENTS 132947  6/1986  Japan .

Primary Examiner—Lewis T. Jacobs
Assistant Examiner—Susan Berman
Attorney, Agent, or Firm—Frishauf, Holtz, Goodman & Woodward

[57] ABSTRACT

There is disclosed a photosensitive resin composition solution for formation of a printed wiring board permanent mask to be coated on a substrate to be coated according to the curtain flow coating method or the roll coating method, which comprises (A) an oligomer having at least one epoxy group and at least one polymerizable vinyl group in the side chain, (B) a photopolymerization initiator, (C) an epoxy resin curing agent, (D) a filler and (E) a solvent, characterized in that (1) the solvent (E) contains 10 to 20% by weight of at least one low boiling point solvent selected from the group consisting of methanol, ethanol, methyl ethyl ketone, acetone and ethyl acetate based on the total amount of the solvent, and (2) the composition solution has a viscosity at 25° C. of 100 mPas or more and 200 mPas or less.

22 Claims, No Drawings

PHOTOSENSITIVE RESIN COMPOSITION SOLUTION

BACKGROUND OF THE INVENTION

This invention relates to a photosensitive resin composition solution. More particularly, the present invention relates to a photosensitive resin composition solution for formation of a permanent mask for printed board.

As the photosensitive resin composition for formation of permanent mask of printed wiring board, there have been already known various compositions, such as the photosensitive resin composition composed mainly of an acrylic polymer and a photopolymerizable monomer (Japanese Provisional Patent Publications No. 56018/1978 and No. 1018/1979), the photosensitive resin composition composed mainly of an acrylic polymer, a photopolymerizable monomer and an epoxy resin (Japanese Patent Publications No. 43091/1977 and No. 43092/1977) and the photosensitive resin composition composed mainly of an epoxy resin to which photoreactivity is imparted (Japanese Provisional Patent Publications No. 82073/1979, No. 62636/1983 and No. 132947/1986). Among these, with respect to solder heat resistance and developability, the photosensitive resin composition disclosed in Japanese Provisional Patent Publication No. 132947/1986 is preferred for permanent mask.

On the other hand, the methods for forming photosensitive layers on substrates by use of photosensitive resin compositions may be classified into (a) the film method [the method in which a photosensitive material shaped in uniform film obtained by coating and drying a photosensitive resin composition solution on a support such as polyethyleneterephthalate film, etc. is pressure adhered onto a substrate by using a laminator, etc. to form a photosensitive layer on the substrate] and (b) the direct coating method [the method in which a photosensitive resin composition solution is coated and dried onto a substrate by means of a coating device (e.g., curtain flow coating device, roll coating device, etc.) to form a photosensitive layer on the substrate].

According to the above method (a), a photosensitive layer with uniform film thickness can be formed on a substrate simply without requiring special trained skill. However, when the circuit thickness of the substrate is large, it is difficult to embed sufficiently the photosensitive layer at the portion between circuit and circuit, whereby bubbles may remain between the circuits. For avoiding this problem, it becomes necessary to use a thick film photosensitive material and further to effect pressure adhesion onto the substrate under vacuum. For this purpose, a special and expensive device (e.g., vacuum laminator) is required.

In contrast, in the above method (b), the device is inexpensive and a relatively thinner photosensitive layer can be easily formed on a substrate, but trained skill is required for forming a thick photosensitive layer uniformly. Also, in the case when the circuit thickness of the substrate is large, although bubbles between the circuits in the film method will be avoided, there ensues another problem. That is, due to flowing of the resin composition solution from the circuit upper portion, flowing into the portion around through-hole, the photosensitive layer film thicknesses on the circuit and around the through-hole become thinner (this is called "poor covering"), whereby such portions are susceptible to damage in the subsequent soldering treatment, etc.

The methods for solving the problem in the above method (b) are proposed in Japanese Provisional Patent Publications No. 82073/1979 and No. 62636/1983.

More specifically, in these published specifications, in forming a permanent mask on a substrate by coating a substrate with a specific liquid resin composition solution by use of a curtain flow coater to form a photosensitive layer on the substrate, the viscosity of the resin composition solution provided for coating is described as 500 to 1200 mPas in the case of a composition containing no filler (Japanese Provisional Patent Publication No. 82073/1979), and 200 to 700 mPas in the case of a composition containing a filler (Japanese Provisional Patent Publication No. 62636/1983), and the problem of covering as described above is stated to be solved by such methods.

However, when such proposed methods are applied for the direct coating method of the resin composition composed mainly of a resin containing a polymerizable vinyl group and a thermally reactive epoxy group as disclosed in Japanese Provisional Patent Publication No. 132949/1986, it has been found that no satisfactory result can be obtained for the problem of covering. That is, in the roll coating method or the curtain flow coating method of the resin composition solution, remaining of bubbles frequently occurred between the circuits on the substrate with a highly viscous solution of high concentration while there was the problem of covering insufficiency of the circuit and flowing into through-hole with a solution of low concentration and low viscosity. Thus, no viscosity region could be found where none of these problems occurred and good coating could be effected stably.

SUMMARY OF THE INVENTION

An object of the present invention is to remove the drawbacks of the prior art as described above and provide a resin composition solution for obtaining a printed wiring board having high reliability with sufficient permanent mask film thickness at the upper portion of the circuit and around the through-hole on the substrate.

The proposal of the present invention is a photosensitive resin composition solution for formation of a printed wiring board permanent mask to be coated on a substrate to be coated according to the curtain flow coating method or the roll coating method, comprising (A) an oligomer having at least one of an epoxy group and at least one of a polymerizable vinyl group in the side chain, (B) a photopolymerization initiator, (C) an epoxy resin curing agent, (D) a filler and (E) a solvent, characterized in that (1) said solvent (E) contains 10 to 20% by weight of a one low boiling point solvent selected from the group consisting of methanol, ethanol, methyl ethyl ketone, acetone and ethyl acetate based on the total amount of the solvent, and (2) the composition solution has a viscosity at 25° C. of 100 mPas or more and 200 mPAS less.

DESCRIPTION OF THE PREFERRED EMBODIMENTS

The resin composition solution of the present invention contains an oligomer having at least one of an epoxy group and at least one of a polymerizable vinyl group in the side chain as the essential component (A). Suitable examples of such oligomer are described in Japanese Provisional Patent Publications No. 132947/1986, No. 264340/1986 and No. 264341/1986.

Particularly, it is preferable to use an oligomer obtained by reacting isocyanatoethyl methacylate with an unsaturated compound, which is obtained by addition reaction of a compound having at least two epoxy groups and an unsaturated carboxylic acid at an acid equivalent/epoxy equivalent ratio in the range of 0.1 to 0.98, at a ratio relative to the hydroxyl group of the unsaturated compound of an isocyanate equivalent/hydroxyl group equivalent ratio in the range of 0.1 to 1.2.

Examples of the compound having at least two epoxy groups may include bisphenol A type epoxy resins obtained by the reaction between bisphenol A and epichlorohydrin (e.g., Epikote 812, Epikote 828, Epikote 1001, etc. produced by Shell Chemical), brominated bisphenol A type epoxy resins (e.g., Epitoto YDB-340, YDB-400, etc. produced by Toto Kasei K.K.), bisphenol F type epoxy resins (e.g., Epototo YDF-170, TDF-190, etc. produced by Toto Kasei K.K.), epoxy compounds obtained by addition of alkylene oxide to bisphenol A, followed by reaction with epichlorohydrin (e.g., Epolite 3002, etc. produced by Kyoeisha Yushi K.K.), hydrogenated bisphenol A type epoxy resins (e.g., Suntoto ST-1000, ST-3000, etc. produced by Toto Kasei K.K.), glyoxal type epoxy resins (e.g., Epototo YDG-414, etc. produced by Toto Kasei K.K.), glycidylamine type epoxy resins (e.g., Epototo YDM-120, YH-434, etc. produced by Toto Kasei K.K.), ortho-cresol novolac type epoxy resins (e.g., EOCN102, etc. produced by Nihon Kayaku K.K.), phenol novolac type epoxy resins (e.g., YDPN-638, etc. produced by Toto Kasei K.K.), brominated phenol novolac type epoxy resins (e.g., BREN, etc. produced by Nihon Kayaku K.K.), alicyclic epoxy compounds (e.g., Chissonox 221, Chissonox 201, etc. produced by Chisso K.K.), glycidyl ether type epoxy resins obtained by the reaction between a dicarboxylic acid such as phthalic acid, etc. and epichlorihydrin (e.g., Shodyn 508, Shodyn 540, Shodyn 550, etc. produced by Showa Denko K.K.), glycidylamine type epoxy resins (Epikote 604, etc. produced by Shell Chemical K.K.), trimethylolpropane polyglycidyl ether, and others.

As the unsaturated carboxylic acid, acrylic acid, methacrylic acid, β-furylacrylic acid, β-styrylacrylic acid, etc. may be employed.

In the present invention, the addition reaction between the compound having at least two epoxy groups and unsaturated carboxylic acid is as shown in the scheme (I) shown below, which may be carried out in a conventional manner at an acid equivalent/epoxy equivalent ratio in the range of 0.1 to 0.98. If the acid equivalent/epoxy equivalent ratio is less than 0.1, the photocured coating is liable to be swollen by the developing processing after image exposure. When the acid equivalent/epoxy equivalent ratio exceeds 0.98, adhesiveness, heat resistance, etc. will be lowered. The range of 0.15 to 0.6 is particularly preferred.

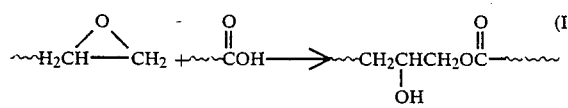

The unsaturated compound of the present invention can be obtained by reacting with stirring the above unsaturated carboxylic acid and the above compound having epoxy group at 70 to 110° C. with the use of a tertiary amine such as triethylamine, tri-n-butylamine, diethylcyclohexylamine, etc., a quaternary ammonium salt such as benzyltrimethylammonium chloride, benzyltriethylammonim chloride, etc. as the catalyst, and hydroquinone, p-methoxyphenol, etc. as the polymerization inhibitor. In carrying out the reaction, as the reaction solvent, an organic solvent such as methyl ethyl ketone, methylcellosolve acetate, 1,1,1-trichloroethane, etc., a photopolymerizable monomer such as polypropylene glycol diacrylate, ethylcarbitol acrylate, etc. can be used.

The reaction of isocyanatoethyl methacrylate with the unsaturated compound obtained by the addition reaction of the compound having epoxy group and the unsaturated carboxylic acid as described above is as shown below by the scheme (II), and the reaction of isocyanatoethyl methacrylate with the total hydroxyl groups in the unsaturated compound is carried out in a conventional manner with an isocyanate equivalent/hydroxyl group equivalent ratio in the range of 0.1 to 1.2. If the isocyanate equivalent/hydroxyl group equivalent ratio is less than 0.1, developing with a flame retardant organic solvent such as 1,1,1-trichloroethane, etc. can be done with difficulty, and also photocurability will be lowered. If the isocyanate equivalent/hydroxyl group equivalent ratio exceeds 1.2, gelling is liable to occur during the reaction, and also characteristics such as heat resistance, etc. will be lowered. The range of 0.9 to 1.2 is particularly preferred. After the reaction, by use of an alcohol such as methanol, ethanol, 2-hydroxyethyl acrylate, etc., the remaining isocyanatoethyl methacrylate should be urethanized to be deactivated desirably in safety and improvement of storage stability.

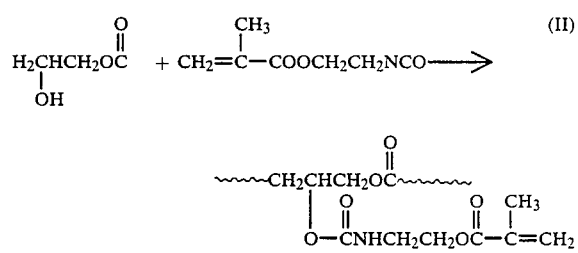

For example, by carrying out the addition reaction between the compound having at least two epoxy groups and the unsaturated carboxylic acid as described above, and subsequently reacting isocyanatoethyl methacrylate with the resultant product at an equivalent ratio within the range as specified above with addition of a urethanization catalyst such as dibutyltin dilaurate, dibutyltin di-2-ethylhexoate, etc. under stirring at 50° to 110° C., an oligomer having an epoxy group and a polymerizable vinyl group in the side chain can be obtained. Under such reaction conditions, side reactions such as the reaction of a urethane bond and an epoxy group, thermal polymerization of unsaturated bonds, etc. can be prevented, whereby an oligomer having an epoxy group and a polymerizable vinyl group in the side chain can be obtained without formation of gel-like product.

As the particularly preferable oligomer in the present invention, there may be included ortho-cresol novolac type epoxy resin/acrylic acid/isocyanatoethyl methacrylate (acid equivalent/epoxy equivalent ratio=0.1 to 0.98, isocyanate equivalent/hydroxyl group equivalent ratio=0.1 to 1.2) type reaction products, ortho-cresol novolac type epoxy resin/methacrylic acid/isocyanatoethyl methacrylate (acid equivalent/epoxy equivalent ratio=0.1 to 0.98, isocyanate equivalent/hydroxyl group equivalent ratio=0.1 to 1.2) type reaction products, bisphenol A type epoxy resin/acrylic acid/isocyanatoethyl methacrylate (acid equivalent/epoxy equivalent ratio=0.1 to 0.98, isocyanate equivalent/hydroxyl group equivalent ratio=0.1 to 1.2) type reaction products, bisphenol A type epoxy resin/methacrylic acid/isocyanatoethyl methacrylate (acid equivalent/epoxy equivalent ratio=0.1 to 0.98, isocyanate equivalent/hydroxyl group equivalent ratio=0.1 to 1.2) type reaction products, etc.

The resin composition solution of the present invention contains a photopolymerization initiator as the essential component (B). Examples of such photopolymerization initiator may include substituted or unsubstituted polynucleic quinones such as 2-ethylanthraquinone, 2-t-butylanthraquinone, octamethylanthraquinone, 1,2-benzanthraquinone, 2,3-diphenylanthraquinone, etc.; ketoaldonyl compounds such as diacetylbenzyl, etc.; α-ketoaldonyl alcohols such as benzoin, pivalone, etc.; ethers; α-hydrocarbon substituted aromatic acyloins such as α-phenyl-benzoin, α,α-diethoxyacetophenone, etc.; aromatic ketones such as benzophenone, 1-hydroxycyclohexyl phenyl ketone, 2-methyl-4-(methylthio)phenyl-2-morpholino-1-propanone, 4,4'-bisdialkylaminobenzophenone, etc.; thioxanthones such as 2-methylthioxanthone, 2,4-diethylthioxanthone, 2-chlorothioxanthone, 2-isopropylthioxanthone, 2-ethylthioxanthone, 3,6-bis(2-methyl-2-morpholino-1-propanonyl)-9-n-butylcarbazole and the like. They can be used either individually or in combination. Examples of combination may include 2,4,5-triallylimidazole dimer with 2-mercaptobenzoquinazole, leuko crystal violet, tris(4-diethylamino-2-methylphenyl)methane, etc. Also, it is possible to use an additive, which itself has no photopolymerizability but can improve photopolymerizability when used in combination with the above substance, such as a tertiary amine such as triethanolamine, etc. for benzophenone, isoamyl dimethylaminobenzoate, N-methyldiethanolamine, bisethylaminobenzophenone, etc. for thioxanthones.

The resin composition solution of the present invention is preferably use 0.1 to 30 parts by weight of the above photopolymerization initiator (B) per 100 parts by weight of (A) the oligomer having epoxy group and polymerizable vinyl group in the side chain in forming a permanent mask excellent in resolution, solder heat resistance, etc.

The resin composition solution of the present invention contains an epoxy resin curing agent as the essential component (C). Examples of such epoxy resin curing agent may include dicyandiamide, imidazole type curing agents such as 2-ethyl-4-methylimidazole, 1-cyanoethyl-2-phenylimidazole, 2,4-diamino-6-[2'-undecylimidazole-(1)']-ethyl-s-triazine and the like; biguanide type curing agents such as 1-(o-tolyl)biguanide, 2,6-xylylbiguanide and the like; boron trifluoride amine complexes such as BF3-monoethylamine complex, BF3-triethanolamine complex, and the like; amine imide type curing agents (Epicure YPH-201, produced by Yuka-Shell Epoxy K.K.); etc. Imidazole type curing agents are preferred. These curing agents can be used as a mixture of two or more kinds.

The content of (C) the epoxy resin curing agent in the resin composition solution of the present invention may preferably be 0.1 to 10 parts by weight based on 100 parts by weight of (A) the oligomer having an epoxy group and a polymerizable vinyl group in the side chain. At a level lower than 0.1 part by weight, characteristics such as solvent resistance, etc. are poor due to insufficient curing of the coating, while at a level in excess of 10 parts by weight, badness such as development remaining, etc. is liable to be generated.

The photosensitive resin composition solution of the present invention contains a filler as the essential component (D). Examples of available fillers may include fine particulate talc, silica, barium sulfate, alumina, aluminum hydroxide, calcium carbonate, kaolin, clay, antimony trioxide, etc.

These fillers can be used either alone or as a mixture, and in an amount of 5 to 60 parts by weight, preferably 10 to 50 parts by weight, per 100 parts by weight of the oligomer (A).

The photosensitive resin composition solution of the present invention contains a solvent as the essential component (E). The solvent must be a solvent mixture of at least two kinds, and as one component thereof, it is required to contain 10 to 20% by weight of at least one low boiling point solvent selected from the group consisting of methanol, ethanol, methyl ethyl ketone, acetone and ethyl acetate based on the total amount of the solvent. If the content of the low boiling point solvent is less than 10% by weight, covering which is the object of the present invention cannot be attained, while if it is over 20% by weight, due to ready volatilization of such low boiling point solvents, it becomes difficult to manage the viscosity to a necessary value for practicing the present invention, and also, due to insufficient flow of the photosensitive resin composition solution between the circuits, there will frequently ensue the problem of remaining of bubbles. Other solvents comprising 90 to 80 by weight of the total amount of the solvent may be any one capable of dissolving the oligomer (A) of the present invention and having relatively higher boiling point (at least 100° C.), as exemplified by toluene, xylene, cyclohexanone, methyl isobutyl ketone, 2-methyl-1-butanol, methyl or ethyl or butyl monoether of ethylene glycol or propylene glycol, 2-ethoxyethylacetate, 2-methoxyethylacetate, diethylene glycol monoethyl ether, etc. Among them, 2-ethoxyethylacetate is preferred for being an excellent solvent and having relatively lower volatility. Of course, for other purposes, such as effecting dissolution, dispersion of the above photopolymerization initiator (B), a small amount of other solvent than those as mentioned here such as methylene chloride, etc. may be added without obstacle in practicing the present invention.

The amount of the solvent (E) to be used in the photosensitive resin composition solution in the present invention is required to be controlled so that the viscosity of the composition solution at 25° C. may become 100 mPas or more and 200 mPas or lower, and is generally 40% by weight to 50% by weight in the composition solution. If the viscosity of the photosensitive resin composition solution is less than 100 mPas, covering which is the object of the present invention cannot be attained, while it is over 200 mPas, flowing of the resin composition solution between the circuits becomes insufficient to cause remaining of bubbles. Since a part of the solvent in the composition solution is reduced by volatilization by circulation of the composition solution during coating according to the curtain flow coating method or the roll coating method, the viscosity should be managed by adding constantly the solvent so that the viscosity of the composition solution may become a value within the range as specified above. In practical working, since most of the solvents reduced by volatilization are low boiling point solvents, it has been ascertained that only the low boiling point solvent rather than the solvent mixture may be added.

The photosensitive resin composition solution of the present invention can incorporate, as the components other than (A) to (E) as described above, various additives conventionally used in photosensitive resin compositions such as thermal polymerization inhibitor, colorant, flame retardant agent, polymerizable oligomer or monomer, etc.

The photosensitive resin composition solution of the present invention may be generally prepared by mixing and dispersing the oligomer of (A), the filler of (D) and a part of the solvent (E) by a roller, and then stirring with addition of the remaining components by means of a stirring machine having rotational blades or a planetarium mixer, etc. By sufficient stirring, uniform dispersion should be effected by measuring the viscosities by, for example, E type rotary viscometer (E) type viscometer produced by Tokyo Keiki K.K., VISCONIC E HD (trade name), roter angle 1° 34') at the rotational numbers of 6 rpm and 10 rpm so that the ratio of the both values (viscosity value at 6 rpm/viscosity value at 10 rpm) may be 1.05 or less.

The photosensitive resin composition solution of the present invention can be coated on a substrate according to the curtain flow coating method or the roll coating method. In carrying out coating, the substrate is preferably controlled to a temperature of 20° C. to 40° C. After coating on the substrate, the coating is left to stand at 20° to 30° C. for 10 to 30 minutes to volatilize a part of the solvent and then dried by heating generally at 60° C. to 120° C. for 10 to 30 minutes. Then, exposure is effected through a negative mask, followed by developing. After developing, for improvement of the characteristics of the coating, post-exposure and/or heating treatment at 80° C. to 200° C. is effected. By these procedures, a protective film satisfying the characteristics as a permanent mask such as solder mask, etc. can be obtained.

The photosensitive resin composition solution of the present invention has a relatively lower viscosity of 100 mPas or more and 200 mPas or less, and therefore can flow immediately after coated on a substrate to embed the spaces between the circuits on the back surface of the substrate, whereby there remains no bubble at all. However, on the other hand, the composition solution of the present invention will become abruptly highly viscous due to removal by volatilization of a low boiling point solvent such as methanol, etc. contained therein. Particularly, since, the coated fill becomes thinner on the circuit or around the through-hole on the surface of the substrate than at other portions, volatilization and dissipation of the solvent is greater, whereby the solution becomes highly viscous to be lowered in flowability. As the result, flowing of the coated film on the circuit and around the through-hole is inhibited, to ensure coating with sufficient thickness at these portions. The mechanism in which the effect of the present invention is exhibited by the photosensitive resin composition solution may be estimated as described above, but the present inventors are not intended to limit the present invention by such descriptions.

EXAMPLES

Example 1

(a) Preparation of oligomer having an epoxy group and a polymerizable vinyl group in the side chain:

A 500-liter reactor equipped with a thermometer, a stirring device and a cooling tube was charged with 236 kg of an ortho-cresol novolac type epoxy resin (EOCN104S, trade name, produced by Nihon Kayaku K.K.), 14.5 kg of cellosolve acetate (trade name of 2-ethoxyethyl acetate) and 0.3 kg of p-methoxyphenol, and the contents were made homogeneous by heating to 80° C. A solution of 0.1 kg of benzyltrimethylammonium chloride dissolved in 18 kg of acrylic acid was added, and the reaction was carried out at 80° C. for about 25 hours to make the acid value 0.8. Subsequently, the temperature was dropped to 60° C., 0.05 kg of dibutyltin dilaurate was added, and further 51 kg of isocyanatoethyl methacrylate was added dropwise over about 3 hours while maintaining the reaction temperature at 60° C. After completion of the dropwise addition, the reaction temperature was gradually raised up to 80° C. over about 5 hours, and then the temperature was dropped by stirring for about one hour to obtain an oligomer solution (A) with a solid content of 68% by weight.

(b) Preparation of photosensitive resin composition solution:

The oligomer solution (A) obtained in (a) (103.8 kg), 35.6 kg of silica, 7.1 kg of talc and 2.0 kg of antimony trioxide were thoroughly kneaded by passing through three rolls for three times. To the resultant kneaded product were added 46.2 kg of the oligomer solution obtained in (a), 16.8 kg of cellosolve acetate, 10.0 kg of benzophenone, 1.0 kg of Michler's ketone and 3.7 kg of Phthalocyanine Green (TY-50323, trade name, produced by Toyo Ink K.K.), and the mixture was stirred by means of a stirring device equipped with stirring blades at a rotational number of 200 to 300 rpm for about 3 hours to obtain a resin mother solution (B). The solution had a solid content of 72% by weight.

The resin mother solution (B) obtained as described above, 23.5% by weight of methylcellosolve (trade name of ethylene glycol monomethyl ether) solution of boron trifluoride monoethylamine complex (C), cellosolve acetate and low boiling point solvents were mixed at formulations shown in Table 1, followed by stirring by means of the same stirring device as described above for about one hour, to obtain photosensitive resin composition solutions.

(c) Coating onto printed wiring board:

The photosensitive resin composition solution obtained in (b) was coated onto one surface of a through-hole substrate with copper on both surfaces of 25 cm×20 cm having a through-hole of 1 mm in diameter and a circuit of 53 μm thickness, 160 μm width and 160 μm interval by means of a curtain flow coating device produced by Iwata Coating Machine Kogyo K.K. with the conveyor speed being set suitably within the range of 100 to 130 m/min so that the dried coating film thickness on a flat plate became 45 to 50 μm. The substrate was dried at room temperature for 20 minutes, and then at 80° C. for 30 minutes.

(d) Evaluation of characteristics of the coated substrate:

The substrate obtained in (c) was subjected at the coated side to exposure of 600 mJ/cm$^2$ by a ultra-high pressure 3 kw mercury lamp produced by Oak Seisakusho, followed by heating treatment at 150° C. for 30 minutes. This product was evaluated as follows.

(i) Appearance observation ... The whole surface of the substrate was observed with naked eyes about whether bubbles existed within the resin film. The case when there was no bubble is rated as O, the case when 1 to 5 bubbles existed as Δ, the case when 6 to 20 bubbles as X, and the case when 21 or more bubbles as XX.

(ii) Solder heat resistance ... After coating and drying of a rosin type flux A-226 (trade name) produced by Tamura Kaken K.K. on the substrate, the whole substrate was dipped in a molten solder bath of 260° C. for 30 seconds, and then washed by dipping into trichlene. For this product, floating of the resin film from the substrate, and foaming were observed. The product without floating and foaming is rated as O, the product with occurrence at 1 to 3 sites as Δ, and that with occurrence at 4 or more sites as X.

(iii) Measurement of film thickness ... The circuit portion and the through-hole portion of the substrate were cut out and, after casting with an epoxy resin, cut by a diamond cutter so that the cross-sections of the circuit portion and the through-hole portion could be observed and the cut surface were polished with alumina powder. Then, the resin film thickness on the circuit and at 100 μm portion from the through-hole opening end was measured by a metal microscope of 500 magnification. Thickness of 10 μm is rated as O, and that of 9 μm or less as X.

In the evaluations of the above three points, one rated as O in all the points is rated as O, one rated as O in two points and Δ in one point as Δ, and one rated as Δ or X in two or more points as X, as overall evaluation. These results are also listed in Table 1.

TABLE 1

| | Experimental No. | | | | | |
|---|---|---|---|---|---|---|
| | 1 - 1 | 1 - 2 | 1 - 3 | 1 - 4 | 1 - 5 | 1 - 6 |
| Photosensitive resin composition solution Formulation (parts by weight) | | | | | | |
| Resin mother solution (B) | 200 | 200 | 200 | 200 | 200 | 200 |
| Amine complex solution (C) | 8 | 8 | 8 | 8 | 8 | 8 |
| cellosolve acetate | 30.5 | 16 | 38.7 | 38.7 | 38.7 | 38.7 |
| Low boiling point solvent (wt. %) (Note 1) | Methanol 10.3 (10.0) | Methanol 19.0 (19.6) | Methanol 11.2 (10.0) | Ethyl acetate 11.7 (10.4) | Ethanol 11.5 (10.2) | Methyl ethyl ketone 11.9 (10.6) |
| Viscosity (mPas, 25° C.) | 200 | 195 | 155 | 150 | 150 | 150 |
| Characteristics of coated substrate | | | | | | |
| Appearance | O | O | O | O | O | O |
| Solder heat resistance | O | O | O | O | O | O |
| *(Note 2) | (23,17) | (26,19) | (19,13) | (18,13) | (20,14) | (18,12) |
| Film thickness (μm) | O | O | O | O | O | O |
| Overall evaluation | O | O | O | O | O | O |

| | Experimental No. | | | | |
|---|---|---|---|---|---|
| | 1 - 7 | 1 - 8 | 1 - 9 | 1 - 10 | 1 - 11 |
| Photosensitive resin composition solution Formulation (parts by weight) | | | | | |
| Resin mother solution (B) | 200 | 200 | 200 | 200 | 200 |
| Amine complex solution (C) | 8 | 8 | 8 | 8 | 8 |
| cellosolve acetate | 38.7 | 21.0 | 37.9 | 31.5 | 31.5 |
| Low boiling point solvent (wt. %) (note 1) | Acetone 11.9 (10.6) | Methanol 20.7 (19.9) | Methanol 16.2 (13.9) | Methanol 23.4 (20.0) | Ethyl acetate 23.4 (20.0) |
| Viscosity (mPas, 25° C.) | 145 | 160 | 115 | 100 | 105 |
| Characteristics of coated substrate | | | | | |
| Appearance | O | O | O | O | O |
| Solder heat resistance | O | O | O | O | O |
| *(Note 2) | (19,14) | (22,16) | (15,11) | (20,15) | (21,15) |
| Film thickness (μm) | O | O | O | O | O |
| Overall evaluation | O | O | O | O | O |

(Note 1) Ratio of low boiling point solvent in all solvents in photosensitive resin solution (calculated value).
(Note 2) Film thickness, the former being the value on the center of circuit, the latter the value at the portion 100 μm above from the opening end of through-hole.

As shown in Table 1, it can be appreciated that, according to the method of the present invention, there is no bubble remained to give sufficient film thickness on the circuit and around the through-hole, whereby a resin film excellent in solder heat resistance can be formed.

Comparative example 1

Photosensitive resin composition solutions were coated on a substrate according to the curtain flow coating method in entirely the same manner as in Example 1 except for formulating the photosensitive resin composition solutions at ratios shown in Table 2, and their characteristics were evaluated. The results of characteristic evaluation are also shown in Table 2.

TABLE 2

| | Experimental No. | | | | | | |
|---|---|---|---|---|---|---|---|
| | Comparison - 1 | Comparison - 2 | Comparison - 3 | Comparison - 4 | Comparison - 5 | Comparison - 6 | Comparison - 7 |
| Photosensitive resin composition solution Formulation (parts by weight) | | | | | | | |
| Resin mother solution (B) | 200 | 200 | 200 | 200 | 200 | 200 | 200 |

TABLE 2-continued

|  | Experimental No. | | | | | | |
| --- | --- | --- | --- | --- | --- | --- | --- |
|  | Compari-son - 1 | Compari-son - 2 | Compari-son - 3 | Compari-son - 4 | Compari-son - 5 | Compari-son - 6 | Compari-son - 7 |
| Amine complex solution (C) | 8 | 8 | 8 | 8 | 8 | 8 | 8 |
| cellosolve acetate | 33.0 | 44.9 | 49.9 | 39.7 | 7.0 | 48.8 | 12.8 |
| Low boiling point solvent (wt. %) (Note 1) | Not added (0) | Not added (0) | Not added (0) | Methanol 5.4 (5.0) | Methanol 22.9 (24.9) | Methanol 5.8 (5.0) | Methanol 24.9 (24.9) |
| Viscosity (mPas, 25° C.) | 305 | 220 | 195 | 205 | 195 | 140 | 160 |
| Characteristics of coated substrate | | | | | | | |
| Appearance | X | Δ | O | O | XX | O | X |
| Solder heat resistance | X | Δ | X | Δ | XX | X | X |
| *(Note 2) | (24,18) | (20,14) | (11,5) | (14,8) | (30,21) | (12,5) | (24,15) |
| Film thickness (μm) | O | O | X | X | O | O | O |
| Overall evaluation | X | Δ | X | Δ | X | X | X |

(Note 1) Ratio of low boiling point solvent in all solvents in photosensitive resin solution (calculated value).
(Note 2) Film thickness, the former being the value on the center of circuit, the latter the value at the portion 100 μm above from the opening end of through-hole.

From Table 2, it can be understood that by use of a photosensitive resin composition containing no or only a small amount of low boiling point solvent, bubbles will remain when the viscosity is high, while if the viscosity is lowered, film thickness will become abruptly small. As the result, in any case, desirable well-balanced characteristics of bubble and film thickness cannot be obtained, whereby it is difficult to form a resin film with good solder heat resistance. On the other hand, when a large amount of low boiling point solvent is contained, the resin solution will not flow due to abrupt volatilization of the solvent after coating, whereby bubbles were found to remain and also, although not shown in Table 2, volatilization of a low boiling point solvent is also excessive during the coating operation, as dangerous to health and safety of workers.

Example 2

Of the photosensitive composition solutions used in Example 1, the composition solutions of the experiments No. 1-3, 1-6 and 1-8 in Table 1 were coated on the same substrate according to the roll coating method. As the roll coater, a micro-roll coater MRC-450 (trade name) produced by Pilot Seiko K.K. was employed and, after coating at a conveyor speed of 2.7 m/min with a gap between the coating roll and the conveyor of 1.2 mm (0.8 of the substrate thickness), the coating was dried at room temperature for 10 minutes and further at 80° C. for 5 minutes. Further, coating and drying were again similarly repeated, followed finally once again by coating under the same conditions and then drying at room temperature for 20 minutes, and at 80° C. for 15 minutes. By use of the coated substrates, the characteristics were evaluated in the same manner as in Example 1. The results are shown in Table 3.

TABLE 3

|  | Experimental No. | | |
| --- | --- | --- | --- |
|  | 2 - 1 | 2 - 2 | 2 - 3 |
| Photosensitive resin composition solution | *(Note 1) 1-3 | *(Note 1) 1-6 | *(Note 1) 1-8 |
| Characteristics of coated substrate | | | |
| Appearance | O | O | O |
| Solder heat resistance | O | O | O |
| *(Note 2) | (15,12) | (14,12) | (18,14) |
| Film thickness (μm) | O | O | O |
| Overall evaluation | O | O | O |

(Note 1) Ratio of low boiling point solvent in all solvents in photosensitive resin solution (calculated value).
(Note 2) Film thickness, the former being the value on the center of circuit, the latter the value at the portion 100 μm above from the opening end of through-hole.

From Table 3, it can be appreciated that every coated substrate is free from residual bubble, has a resin film with sufficient thickness and excellent solder heat resistance formed.

As is apparent from Examples, by use of the resin composition solution of the present invention, it is possible to obtain a printed wiring board having high reliability with sufficient permanent mask film thickness on the circuit upper portion and at around the corner of the through-hole of the substrate.

What is claimed is:

1. A photosensitive resin composition solution for formation of a printed wiring board permanent mask to be coated on a substrate to be coated according to the curtain flow coating method or the roll coating method, comprising
    (A) an oligomer having at least one epoxy group and at least one polymerizable vinyl group in the side chain,
    (B) a photopolymerization initiator,
    (C) an epoxy resin curing agent,
    (D) a filler and
    (E) a solvent capable of dissolving the oligomer, characterized in that
        (1) said solvent (E) contains 10 to 20% by weight of at least one low boiling point solvent selected from the group consisting of methanol, ethanol, methyl ethyl ketone, acetone and ethyl acetate based on the total amount of the solvent, and
        (2) said composition solution has a viscosity of 100 mPas to 200 mPas at 25° C.

2. A photosensitive resin composition solution for formation of a printed wiring board permanent mask to be coated on a substrate to be coated according to the curtain flow coating method or the roll coating method, comprising
    (A) an oligomer having at least one epoxy group and at least one polymerizable vinyl group in the side chain,
    (B) a photopolymerization initiator, (C) an epoxy resin curing agent,
(D) a filler and
(E) a solvent capable of dissolving the oligomer, characterized in that
  (1) said solvent (E) contains 10 to 20% by weight of at least one low boiling point solvent selected from the group consisting of methanol, ethanol, methyl ethyl ketone, acetone and ethyl acetate based on the total amount of the solvent, and
  (2) said composition solution has a viscosity of 100 mPas to 200 mPas at 25° C.; and
  (3) said oligomer having an epoxy group and a polymerizable vinyl group in the side chain is an oligomer obtained by reacting isocyanatoethyl methacrylate with an unsaturated compound, which is obtained by addition reaction of a compound having at least two epoxy groups and an unsaturated carboxylic acid at an acid equivalent/-epoxy equivalent ratio in the range of 0.1 to 0.98, at a ratio relative to the hydroxyl group of the unsaturated compound of an isocyanate equivalent/hydroxyl group equivalent ratio in the range of 0.1 to 1.2.

3. The photosensitive resin composition solution according to claim 2, wherein the compound having at least two epoxy groups is at least one novolac type epoxy resin selected from the group consisting of orthocresol novolac type resins, phenol novolac type resins and halogenated phenol novolac type epoxy resins.

4. The photosensitive resin composition solution according to claim 2, wherein the oligomer having an epoxy group and a polymerizable vinyl group in the side chain is an oligomer obtained by reacting isocyanatoethyl methacrylate with an unsaturated compound, which is obtained by addition reaction of a compound having at least two epoxy groups and an unsaturated carboxylic acid at an acid equivalent/epoxy equivalent ratio in the range of 0.15 to 0.6 at a ratio relative to the hydroxyl group of the unsaturated ccompound of an isocyanate equivalent/hydroxyl group equivalent ratio in the range of 0.9 to 1.2.

5. The photosensitive resin composition solution according to claim 1, wherein the photopolymerization initiator is selected from the group consisting of substituted or unsubstituted polynucleic quinones, ketoaldonyl compounds, α-ketoaldonyl alcohols, ethers, α-hydrocarbon substituted aromatic acyloins, aromatic ketones, thioxanthones and 3,6 bis(2-methyl-2-morpholino-1-propanonyl)-9-n-butylcarbazole.

6. The photosensitive resin composition solution according to claim 1, wherein a content of the photopolymerization initiator is 0.1 to 30 parts by weight based on 100 parts by weight of the oligomer.

7. The photosensitive resin composition solution according to claim 1, wherein the epoxy resin curing agent is selected from the group consisting of dicyandiamide, imidazole type curing agents, biguanide type curing agents, boron trifluoride amine complexes and amine imide type curing agents.

8. The photosensitive resin composition solution according to claim 1, wherein a content of the epoxy resin curing agent is 0.1 to 10 parts by weight based on 100 parts by weight of the oligomer.

9. The photosensitive resin composition solution according to claim 1, wherein the filler is selected from the group consisting of fine particulate talc, silica, barium sulfate, alumina, aluminum hydroxide, calcium carbonate, kaolin, clay and antimony trioxide.

10. The photosensitive resin composition solution according to claim 1, wherein a content of the filler is 5 to 60 parts by weight per 100 parts by weight of the oligomer.

11. The photosensitive resin composition solution according to claim 1, wherein said solvent (E) further comprises a relatively higher boiling point solvent having a boiling point of at least 100° C.

12. The photosensitive resin composition solution according to claim 11, wherein the higher boiling point solvent is selected from the group consisting of toluene, xylene, cyclohexanone, methyl isobutyl ketone, 2-methyl-1-butanol, methyl or ethyl or propyl monoether of ethylene glycol or propylene glycol, 2-ethoxyethylacetate, 2-methoxyethylacetate and diethylene glycol monoethyl ether.

13. The photosensitive resin composition solution according to claim 1, wherein a content of the solvent is 40% by weight to 50% by weight in the composition solution.

14. The photosensitive resin composition solution according to claim 2, wherein
  the photopolymerization initiator is present in an amount of 0.1 to 30 parts by weight based on 100 parts by weight oligomer and is selected from the group consisting of substituted or unsubstituted polynucleic quinones, ketoaldonyl compounds, α-ketoaldonyl alcohols, ethers, α-hydrocarbon substituted aromatic acyloins, aromatic ketones, thioxanthones and 3,6-bis(2-methyl-2-morpholino-1-propanonyl)-9-n-butylcarbazole; and
  the epoxy resin curing agent is present in an amount of 0.1 to 10 parts by weight based on 100 parts by weight of oligomer and is selected from the group consisting of dicyandiamide, imidazole type curing agents, biguanide type curing agents, and boron trifluoride amine complexes and amine imide type curing agents.

15. The photosensitive resin composition solution according to claim 14, wherein
  the filler is present in an amount of 5 to 60 parts by weight per 100 parts by weight of the oligomer and is selected from the group consisting of fine particulate talc, silica, barium sulfate, alumina, aluminum hydroxide, calcium carbonate, kaolin, clay and antimony trioxide; and
  said solvent (E) further comprises a relatively higher boiling point solvent selected from the group consisting of toluene, xylene, cyclohexanone, methyl isobutyl ketone, 2-methyl-1-butanol, methyl or ethyl or propyl monoether of ethylene glycol or propylene glycol, 2-ethoxyethylacetate, 2-methoxyethylacetate and diethylene glycol monoethyl ether.

16. The photosensitive resin composition solution according to claim 3, wherein
  the photopolymerization initiator is present in an amount of 0.1 to 30 parts by weight based on 100 parts by weight oligomer and is selected from the group consisting of substituted or unsubstituted polynucleic quinones, ketoaldonyl compounds, α-ketoaldonyl alcohols, ethers, α-hydrocarbon substituted aromatic acyloins, aromatic ketones, thioxanthones and 3,6-bis(2-methyl-2-morpholino-1-propanonyl)-9-n-butylcarbazole; and
  the epoxy resin curing agent is present in an amount of 0.1 to 10 parts by weight based on 100 parts by weight of oligomer and is selected from the group consisting of dicyandiamide, imidazole type curing agents, biguanide type curing agents, and boron trifluoride amine complexes and amine imide type curing agents.

17. The photosensitive resin composition solution according to claim 16, wherein the filler is present in an amount of 5 to 60 parts by weight per 100 parts by weight of the oligomer and is selected from the group consisting of fine particulate talc, silica, barium sulfate, alumina, aluminum hydroxide, calcium carbonate, kaolin, clay and antimony trioxide; and said solvent (E) further comprises a relatively higher boiling point solvent selected from the group consisting of toluene, xylene, cyclohexanone, methyl isobutyl ketone, 2-methyl-1-butanol, methyl or ethyl or propyl monoether of ethylene glycol or propylene glycol, 2-ethoxyethylacetate, 2-methoxyethylacetate and diethylene glycol monoethyl ether.

18. The photosensitive resin composition solution according to claim 4, wherein the photopolymerization initiator is present in an amount of 0.1 to 30 parts by weight based on 100 parts by weight oligomer and is selected from the group consisting of substituted or unsubstituted polynucleic quinones, ketoaldonyl compounds, α-ketoaldonyl alcohols, ethers, α-hydrocarbon substituted aromatic acyloins, aromatic ketones, thioxanthones and 3,6-bis(2-methyl-2-morpholino-1-propanonyl)-9-n-butylcarbazole; and the epoxy resin curing agent present in an amount of 0.1 to 10 parts by weight based on 100 parts by weight of oligomer and is selected from the group consisting of dicyandiamide, imidazole type curing agents, biguanide type curing agents, and boron trifluoride amine complexes and amine imide type curing agents.

19. The photosensitive resin composition solution according to claim 18, wherein the filler is present in an amount of 5 to 60 parts by weight per 100 parts by weight of the oligomer and is selected from the group consisting of fine particulate talc, silica, barium sulfate, alumina, aluminum hydroxide, calcium carbonate, kaolin, clay and antimony trioxide; and said solvent (E) further comprises a relatively higher boiling point solvent selected from the group consisting of toluene, xylene, cyclohexanone, methyl isobutyl ketone, 2-methyl-1-butanol, methyl or ethyl or propyl monoether of ethylene glycol or propylene glycol, 2-ethyoxyethylacetate, 2-methoxyethylacetate and diethylene glycol monoethyl ether.

20. The photosensitive resin composition solution according to claim 2, wherein said solvent comprises 10 to 20% by weight of at least one low boiling point solvent selected from the group consisting of methanol, ethanol, methyl ethyl ketone, acetone and ethylacetate based on the total amount of the solvent and 80 to 90% by weight of at least one higher boiling point solvent having relatively higher boiling point of at least 100° C. selected from the group consisting of toluene, xylene, cyclohexanone, methyl isobutyl ketone, 2-methyl-1-butanol, methyl or ethyl or propyl monoether of ethylene glycol or propylene glycol, 2-ethoxyethylacetate, 2-methoxyethylacetate and diethylene glycol monoethyl ether.

21. The photosensitive resin composition solution according to claim 2, wherein said oligomer is obtained by reacting isocyanatoethyl methacrylate with a reaction product of ortho-cresol novolac type epoxy resin, p-methoxyphenol and acrylic acid, said photopolymerization initiator is benzophenone and said epoxy resin curing agent is boron trifluoride monoethylamine complex.

22. The photosensitive resin composition solution according to claim 1, wherein said oligomer is obtained by reacting isocyanathoethyl methacrylate with a reaction product of orthocresol novolac type epoxy resin, p-methoxyphenol and acrylic acid, said photopolymerization initiator is 2-methyl-4-(methylthio)phenyl-2-morpholino-1-propanone of the formula:

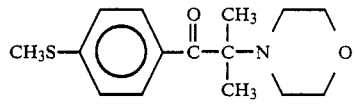

and said epoxy resin curing agent is 2,4-diamino-6[2'-undecylimidazole-(1)']-ethyl-s-triazine of the formula:

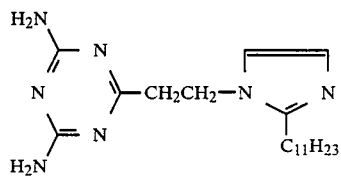

* * * * *